United States Patent [19]

Hongo et al.

[11] 4,190,759
[45] Feb. 26, 1980

[54] PROCESSING OF PHOTOMASK

[75] Inventors: Mikio Hongo; Junichi Nakabayashi, both of Yokohama, Japan

[73] Assignee: Hitachi, Ltd., Japan

[21] Appl. No.: 922,369

[22] Filed: Jul. 6, 1978

Related U.S. Application Data

[63] Continuation of Ser. No. 717,375, Aug. 24, 1976, abandoned.

[30] Foreign Application Priority Data

Aug. 27, 1975 [JP] Japan .................. 50-103031

[51] Int. Cl.² ............................. B23K 9/00
[52] U.S. Cl. ............................... 219/121 LM
[58] Field of Search ............ 219/121 L, 121 LM; 346/76, 108; 29/620, 621, 622, 623, 624, 625; 350/6; 355/53

[56] References Cited

U.S. PATENT DOCUMENTS

| | | | |
|---|---|---|---|
| 3,560,258 | 2/1971 | Brisbane | 219/121 LM |
| 3,584,183 | 6/1975 | Chiaretta | 219/121 LM |
| 3,632,205 | 1/1972 | Marcy | 219/121 X |
| 3,924,093 | 12/1975 | Feldman et al. | 219/121 LM |
| 4,092,515 | 5/1978 | Joslin | 219/121 LM |

Primary Examiner—Bruce A. Reynolds
Assistant Examiner—Fred E. Bell
Attorney, Agent, or Firm—Craig and Antonelli

[57] ABSTRACT

A laser beam of a pulse width 10 to 20 nanoseconds is irradiated and scanned relatively and two-dimensionally on a metal thin film formed on a transparent substrate from the transparent substrate side and through the transparent substrate with a superposition number of laser beam spots set up to at most 15 and to thereby remove a predetermined region of the metal thin film. The irradiated metal film begins to melt from the substrate side and is removed away explosively from the substrate, leaving the substrate substantially unaffected.

8 Claims, 10 Drawing Figures

PROCESSING OF PHOTOMASK

This is a continuation of application Ser. No. 717,375 filed Aug. 24, 1976 abandoned.

This invention relates to the removal processing of a film deposited on a transparent substrate and more particularly to a method and apparatus for removal-processing or removal-machining a photomask film on a transparent substrate in a predetermined region.

Conventionally, use of laser beam has been tried for removing part of a metal thin film of a photomask. The photomask generally consists of a transparent substrate such as a glass plate and an opaque thin film of metal such as chromium deposited on the substrate. The laser beam has been irradiated directly on the metal thin film. When the laser beam is irradiated on the exposed surface of the metal thin film, the metal thin film begins to melt from the outer (exposed) surface to the inside. Along with the evaporation of the metal, the melted metal thin film mixes with part of the glass substrate due to the thermal conduction. As a result, part of the metal thin film remains on the glass substrate, i.e., on the transparent substrate. Therefore, according to the conventionally tried laser processing method of photomasks, it has been impossible to remove undesired portions of the metal thin film perfectly from the substrate and leave only a predetermined pattern of the metal thin film.

A technique of irradiating a YAG laser beam on a chromium film through a glass substrate is proposed in Japanese publication entitled "Irradiation Characteristic of Focused Q-switched YAG Laser Beam" in "Journal of the Japan Society of Precision Engineering", October, 1970, pages 690–696, particularly page 693. However, it is suggested merely as a solution to prevent damage of a beam focusing lens due to explosion or dispersion of chromium in the machining.

An object of this invention is to provide a method of processing a photomask capable of perfectly removing undesired portions of a thin film constituting a photomask and also of removing portions of a thin film larger than the processing spot size of a laser beam.

Another object of this invention is to provide a method of processing a photomask capable of perfectly removing undesired regions of a thin film and of removing portions of the thin film larger than the processing spot size of a laser beam so as to leave a predetermined pattern of the thin film and also of suppressing the roughness and the hollow or pit depth of the processed glass surface below 0.1 μm and as low as possible.

Another object of this invention is to provide an apparatus for processing a photomask capable of automatically removing undesired portions of a thin film and of removing portions of the thin film larger than the processing spot size of a laser beam.

Another object of this invention is to provide an apparatus for processing a photomask capable of automatically removing undesired portions of a thin film and of removing portions of the thin film larger than the processing spot size of a laser beam while suppressing the roughness and collapse or pit depth of the processed glass substrate surface below 0.1 μm and as low as possible.

According to one aspect of this invention, there is provided a method of processing a photomask comprising the steps of preparing a photomask consisting of a transparent substrate and a thin film deposited thereon, irradiating a pulsed laser beam spot on the thin film of the photomask in a predetermined region from the transparent substrate side and through the transparent substrate and scanning the relative position of the pulsed laser beam spot on said photomask in two-dimensional directions, thereby removing the thin film of the photomask in the predetermined region.

According to another aspect of this invention, there is provided a method of processing a photomask comprising the steps of preparing a photomask comprising a transparent substrate and a thin film formed thereon, irradiating a pulsed laser beam having a pulse width of at most 20 nanoseconds on the thin film in a predetermined region from the transparent substrate side of the photomask and through the transparent substrate and relatively scanning the pulsed laser beam with respect to the photomask in two-dimensional directions, and controlling the oscillation frequency of the pulsed laser beam and the scanning speed of the laser beam on the thin film so as to set the superposition number of the laser beam spots in a range of up to 15, thereby removing the thin film in the predetermined region.

According to another aspect of this invention, there is provided an apparatus for processing a photomask comprising a transparent substrate and a thin film deposited thereon, comprising a laser oscillator for intermittently generating a laser beam of pulse form, scanning means for relatively scanning the pulsed laser beam generated from the laser oscillator with respect to said photomask in two-dimensional directions, condensing or focusing optical means for condensing and irradiating the pulsed laser beam on the thin film through the transparent substrate of the photomask, and controller means for controlling the scanning speed of the pulsed laser beam on the thin film through said scanning means and the oscillation repetition frequency of the pulsed laser beam generated from said laser oscillator so as to set the superposition number of the laser beam spots in a range of up to 15.

According to another aspect of this invention, there is provided an apparatus of processing a photomask comprising a transparent substrate and a thin film deposited thereon, comprising means for generating a laser beam of pulse form having a pulse width of at most 20 nanoseconds, means for scanning the laser beam of pulse form generated from the laser generating means relatively and two-dimensionally with respect to the metal thin film deposited on the transparent substrate, condensing optical means for condensing the laser beam of pulse form scanned by the scanning means on a predetermined region of the thin film through the transparent substrate, means for disposing the photomask so that the thin film irradiated by the condensing optical means is on the back side of the transparent substrate with respect to the condensing optical means, and control means for controlling the generation of the laser beam of pulse form from the laser generating means in synchronism with the scanning of the laser beam of pulse form scanned by the scanning means so as to set the superposition number of the laser spots in a range of up to 15.

Other objects, features and advantages of this invention will become apparent from the following detailed description of the embodiments of this invention when taken in conjunction with the accompanying drawings.

There are two types of processing a chromium photomask for the IC manufacture; correcting defective portions of a predetermined circuit pattern (erroneously deposited portions) and removing away a predetermined pattern from a uniform chromium film to leave a circuit pattern.

Figure 1:
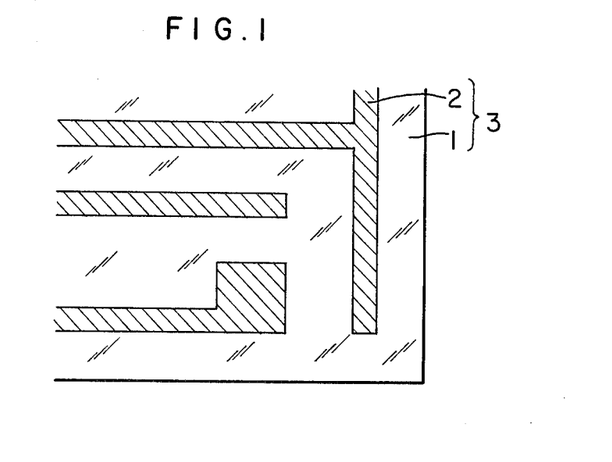
FIG. 1 is a partial plan view of a photomask.
Figure 2:
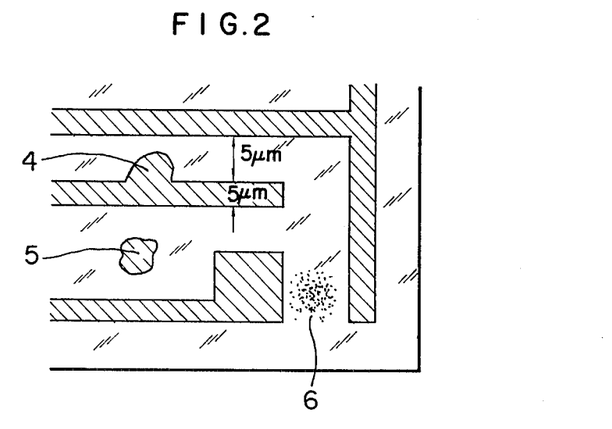
FIG. 2 is a partial plan view of a photomask having defective portions of residual chromium thin film.

Hereinbelow, embodiments of correcting defective portions of a chromium photomask for the IC manufacture will be described. A chromium photomask 3 generally consists of a glass substrate 1 and a chromium thin film 2 deposited on the glass substrate 1 by vacuum evaporation and having a film thickness of about 700 Å and a pattern corresponding to a negative circuit pattern, as shown in FIG. 1. Such a metal thin film 2 may include projecting defectives 4, island defectives 5 and sand-like dispersed defectives 6, as shown in FIG. 2. These defectives 4, 5 and 6 should be perfectly removed from the substrate 1. An embodiment of the apparatus for correcting these defectives will be described referring to FIG. 3.

Figure 3:
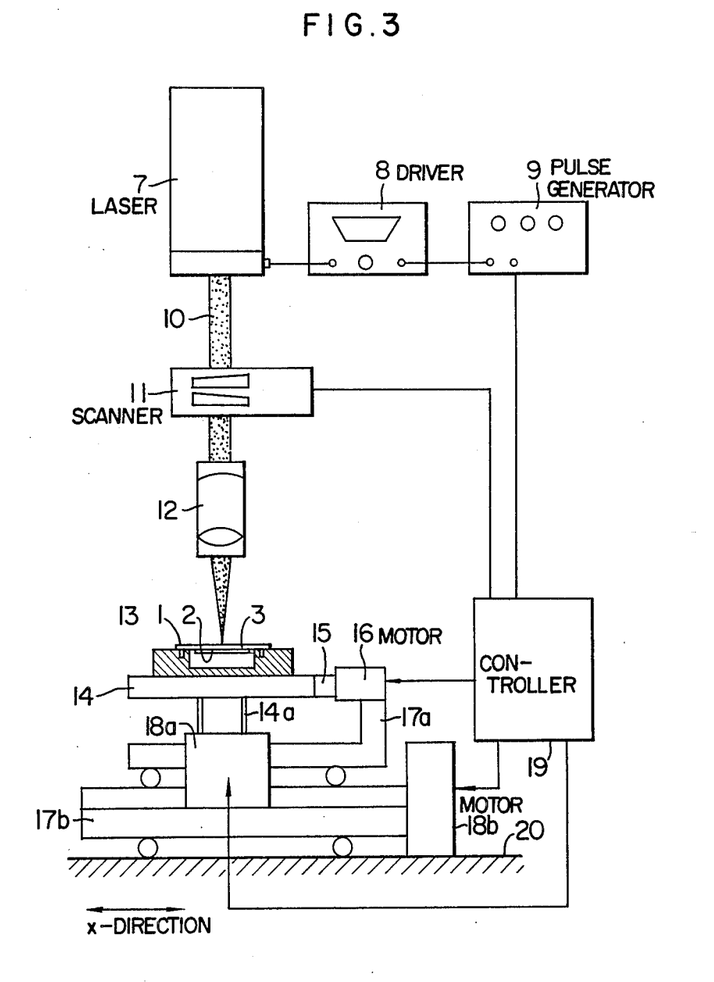
FIG. 3 is a schematic block diagram showing an embodiment of the photomask processing apparatus according to this invention.

In FIG. 3, an Ar ion laser source 7 generates a pulsed laser beam 10 of a short pulse width, i.e. the pulse width at the half of the peak intensity is in a range from 10 to 20 nanoseconds. The laser oscillator 7 is acousto-optically driven by a driver 8 which is driven by a pulse generator 9. The laser beam 10 is scanned by a scanning system 11 in the direction perpendicular to the drawing sheet. The scanning system may be formed of a rotating prism or a rotating mirror. An optical system 12 formed, for example, of convex lenses etc. condenses the laser beam 10 generated from the laser source 7 and scanned by the scanning system 11 on a predetermined plane. A photomask 3 carrying a chromium thin film 2 is mounted and fixed on an evacuated chuck 13 with the chromium film 2 directed toward the evacuated chuck 13. The evacuated chuck 13 is fixed on the upper surface of a resilient or elastic table 14 which is fixed on one ends of resilient thin metal bars 14a fixed on a Y table 17a at the other ends. The resilient table 14 can be finely moved in the horizontal direction in the figure by a feed motor 16 through a fine feed mechanism 15 formed, for example, of a screw mechanism of a fine pitch. The feed motor 16 is mounted on an upper surface of a projecting portion of the Y table 17a. The Y table 17a is allowed to slide in y-direction perpendicular to the drawing sheet by a drive motor 18a fixed on an X table 17b which is allowed to slide in the horizontal direction of the figure. The X table 17b is driven by a drive motor 18b fixed on a base plate 20. A controller 19 applies a signal for determining the oscillation frequency of the pulse generator 9 to be pulse generator in synchronism with the sweep signal obtained from the scanning system 11 in accordance with the y-directional size of the defect of the chromium film, while giving command signal to the drive motor 16 in accordance with the x-directional size of the defect of the chromium film. The controller 19 also applies a signal for stopping the oscillation of the pulse generator 9 to the pulse generator 9 after finely feeding the resilient table 14 by a predetermined amount. Here, the location of the defective portion of the chromium thin film 2 of the photomask 3 is preliminarily detected by a detector (not shown), and the controller 19 drives the drive motors 18a and 18b and hence locates the Y table 17a and the X table 17b on the basis of the positional detection signal to bring the defective portion of the chromium thin film into the scanning area of the scanning system 11 and in the fine feed region of the resilient table 14. The scanning system may be as disclosed in copending U.S. patent application Ser. No. 627,279 filed Oct. 30, 1975 assigned to the same assignee.

According to the above structure, the high power laser beam 10 generated from the laser oscillator 7 is condensed by the condensing optical system 12 and irradiated as a small spot on the defective portion of the chromium thin film 2 from the substrate side and through the transparent substrate 1. The irradiated chromium thin film 2 deposited on the glass substrate begins to melt and evaporate from the inner surface portion at the intersurface between the substrate 1 and the thin film 2. The inner surface portion, however, is isolated from the ambient atmosphere and hence the temperature rise increases the inner pressure extremely high. The chromium thin film 2 is forced to melt from the inner surface to the outer surface exposed to the outer atmosphere by the irradiation of the high power laser beam 10. At some critical point, the melted and evaporated chromium undergoes explosion by the increased inner pressure and scatters away from the glass substrate to leave only the glass plate. There is no remainder of chromium or alloy of chromium and the glass on the glass substrate.

Next, description will be made of the case where the defective portion of the chromium thin film 2 is considerably larger than the spot size of the laser beam condensed by the condensing optical system.

Figure 4:
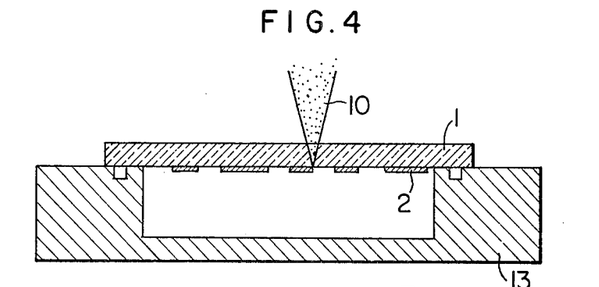
FIG. 4 is an enlarged cross-section of a photomask vacuum-sucked to a vacuum chuck.

A defective portion of a chromium thin film 2 of a photomask 3 fixed on the vacuum chuck 13 with the chromium thin film 2 directed downwards is detected in its position by a detector (not shown) and the positional detection signal is sent to the controller 19. The controller 19 supplies command signals to the drive motors and locates the defective portion of the photomask 3 in the scanning region of the optical scanning system 11 and in the fine feed region of the resilient table 14 by moving the Y table 17a and the X table 17b with respect to the laser beam 10. Here, the laser beam 10 is arranged to condense or focus on the defective portion of the chromium thin film 2 through the glass substrate 1, as shown in FIG. 4.

Figure 5:
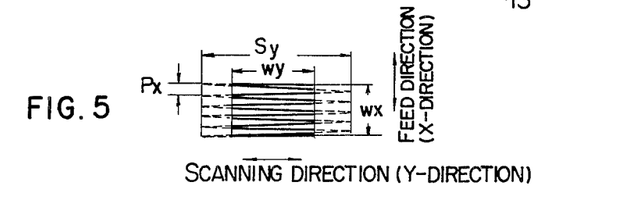
FIG. 5 is a schematic diagram for showing the scanning trace of the laser beam scanned two-dimensionally on a predetermined portion of a chromium thin film.

Then, the real scanning width Wy of the pulsed laser beam 10 in the maximum scanning width Sy limited by the scanning system 11 is determined according to the y-directional size of the defective portion of the chromium film 2, as shown in FIG. 5. The pulse generator 9 is oscillated by the command signal from the controller 19 in synchronism with the scanning of the scanning system so as to irradiate a pulsed laser beam 10 from the laser source 7 on the chromium thin film in the width Wy. Along with the scanning of the laser beam 10 by the scanning system 11, the controller 19 generates a drive command for the drive motor 16 to shift the resilient table 14 through the fine feed mechanism 15 thereby to shift the photomask 3 for a width of Wx corresponding to the x-directional size of the defective portion of the chromium thin film 2 as shown in FIG. 5. Here, for the purpose of preventing the thermal effect to the glass substrate due to the irradiation of the laser beam spots on the same location, the scanning pitch Py of the pulsed laser beam spots 10 is adjusted by the scanning rate of the pulsed laser beam 10 scanned by the scanning system 11 and the oscillation frequency (e.g., in the range of from 10 to 1000 Hz) of the pulse generator 9 which determines the frequency of the pulsed laser beam 10 generated from the laser oscillator 7. Namely, the laser beam 10 generated from the laser source 7 is irradiated on the defective portion of the chromium thin film 2 as a spot of a diameter d ranging from 2 to 5 $\mu$m through the condensing optical system 12 and the superposition number $ny=d/Py$ (where d is the processing spot diameter and Py is the pitch at which the pulsed laser spots are scanned) is arranged to be 1 to 10 in the scanning direction (y-direction). Similarly, the rotation of the drive motor 16 is so adjusted that in the direction perpendicular to the scanning direction, the superposition number of the laser beam spots on the defective portion of the chromium thin film 2, i.e., $nx=d/Px$ (wherein d is the processing spot diameter and Px is the pitch of feeding the laser beam), is in the range of from 1 to 20.

In this way, the pulsed laser beam 10 having the oscillation frequency and the oscillation region determined by the pulse generator 9 is generated from the laser oscillator 7 and condensed and irradiated on the defective portion of the chromium thin film 2 in a processing spot size of 2 to 5 $\mu$m through the condensing optical system 12. While the pulsed laser beam 10 is scanned by the scanning system 11 in the scanning direction (y-direction) at a high rate, the defective portion of the chromium thin film 2 is fed by the drive motor 16 through the fine feed mechanism 15 in the feeding direction (x-direction) at a constant rate for a short distance Wx. As a result, the region of the defective chromium thin film defined by Wx and Wy is irradiated by the pulsed laser beam 10 and the defective portion of the chromium thin film 2 in this region is perfectly removed away.

Next, description will be made of the roughness Rmax and the pit depth of the processed glass surface from which the chromium thin film has been removed by the irradiation of the pulsed laser beam.

In order to produce a trace of overlapping spots the above laser machining system may also scan a laser spot on the same line to be scanned twice or more. For example, the spot may be at first scanned on a line to be scanned with a superposition number $nx=0.8$, and then may be scanned once more on the same line from the start point of scanning shifted by a half the pitch, i.e., $\frac{1}{2}$ Px. As a result, the superposition number on the given line of x-direction totally becomes 1.6. Thus, it will be understood that the lower limit of the superposition number nx or ny may be more than 1 as a result of total scanning.

Figure 6:
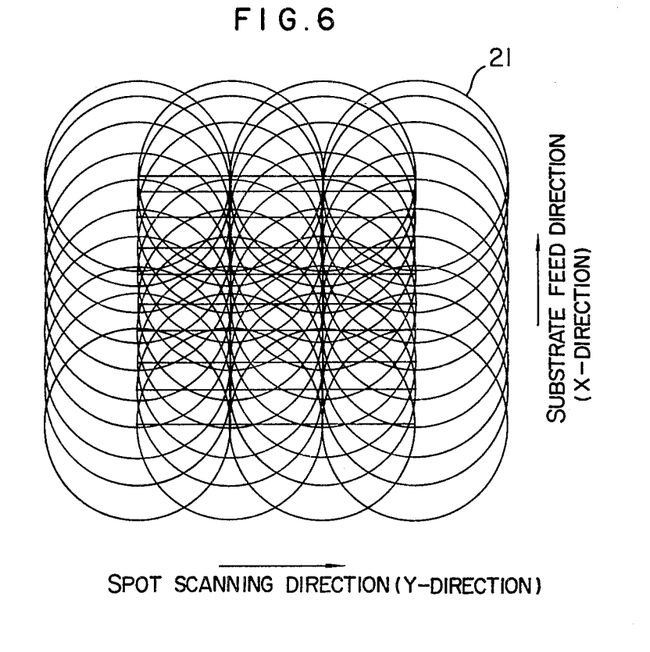
FIG. 6 is a diagram for showing the two-dimensional superposition of laser beam spots.

When a pulsed laser beam having a repetition frequency $f=250$ Hz is condensed to a processing spot diameter $d=2$ $\mu$m and irradiated on a defective portion of the chromium thin film 2 with a scanning rate $vy=250$ $\mu$m/sec given by the scanning system 11, the y-pitch Py of the spots of the laser beam 21 becomes $Py=vy/f=1$ $\mu$m and the superposition number ny of the spots 21 in the y-direction becomes $ny=d/Py=2$. Further, when the feed speed of the chromium thin film 2 vx by the resilient table 14 is set at $vx=0.6$ $\mu$m/sec and the scanning of the pulsed laser beam is arranged to reciprocate once in one second, the average pitch px of the spots becomes $px\approx vx/2\approx 0.3$ $\mu$m and the superposition number nx of the spots 21 in the x-direction becomes $nx=d/px=7$. The superposition of the laser spots 21 in the feed direction (x-direction), however, is only realized in the reciprocating action of the scanning of the pulsed laser beam 10. Namely, there is a time lag for the laser beam to traverse the same spot again and the thermal effect generated by the laser beam irradiation does not remain to the time when the laser beam comes back to the same spot again. Thus, comparing the cases when the superposition number ny of the spots 21 in the y-direction is 2 and when the superposition number nx of the spots 21 in the x-direction is 7, the roughness and the pit depth of the processed surface is superior in the case of x-direction and the problem is limited to the case of y-direction. Therefore, the roughness and the pit depth of the processed surface with respect to the superposition of the spots in the y-direction (scanning direction) will be described next.

Figure 7A:
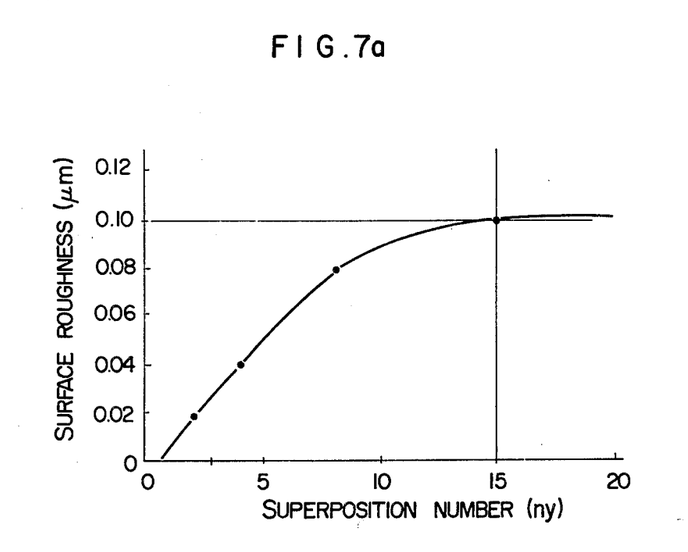
FIG. 7a is a graph for showing the relation of the roughness of the processed surface with respect to the superposition of the laser beam spots.
Figure 7B:
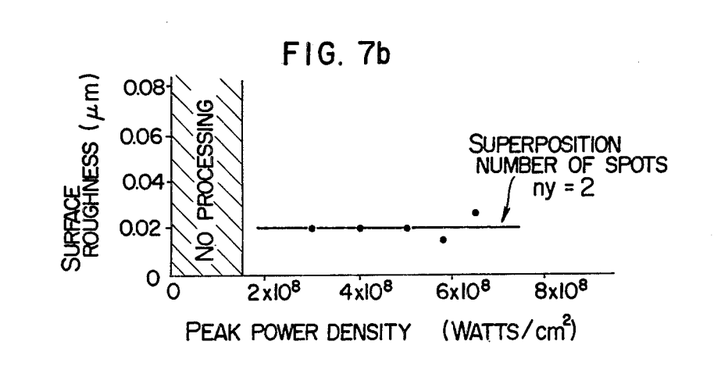
FIG. 7b is a graph for showing the relation of the roughness of the processed surface with respect to the peak power density of the laser beam pulse.
Figure 8A:
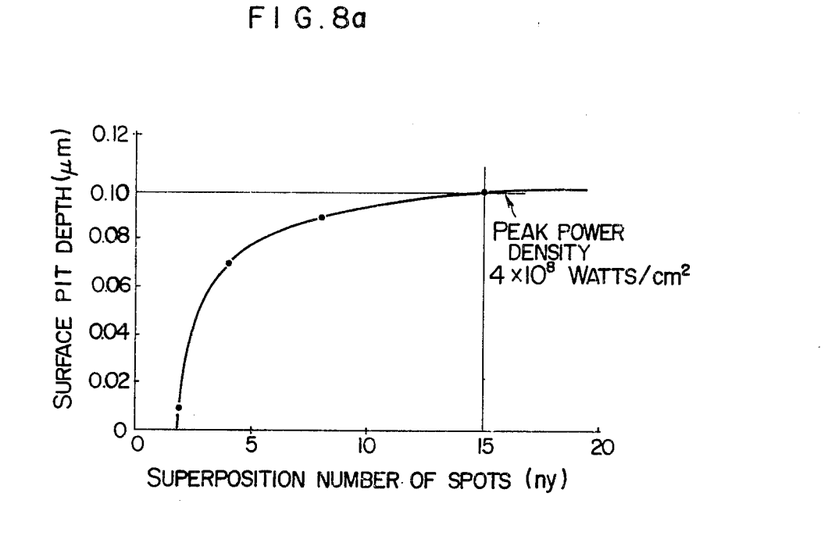
FIG. 8a is a graph for showing the pit depth of the processed surface with respect to the superposition number of the laser beam spots.
Figure 8B:
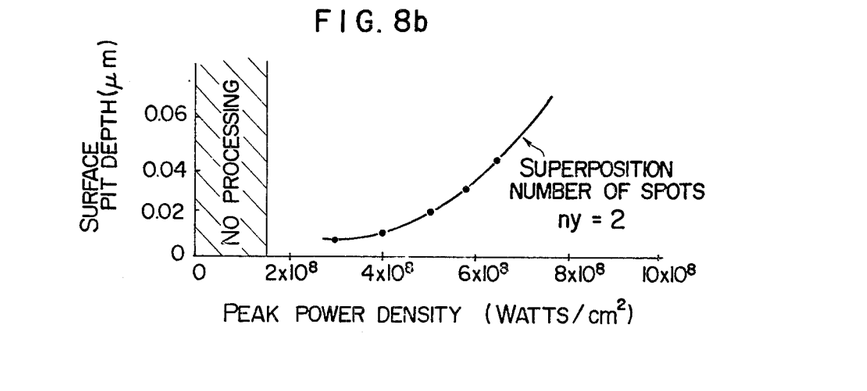
FIG. 8b is a graph for showing the pit depth of the processed surface with respect to the peak power density of the laser beam pulse.

Namely, when the superposition number ny of the spots was set at 2, the half width of a pulse output was set in the range of from 10 to 20 nanoseconds and the peak power density of the pulsed laser beam was varied in the range of $2\times 10^8$ to $8\times 10^8$ watts/cm$^2$ by the adjustment of the power source current and the output of the driver 8, the roughness Rmax of the processed surface from which the chromium thin film was removed away was constant at 0.02 $\mu$m as shown in FIG. 7b. Thus, it was found that the peak power density (watts/cm$^2$) had no relation to the roughness of the processed surface in this case. On the other hand, when the peak power density of the pulsed laser beam was set at $4\times 10^8$ watts/cm$^2$ and the superposition number ny of the laser spots in the y-direction was varied from 2 to 20, it was found that the roughness Rmax of the processed surface rapidly decreased from the value of 0.1 $\mu$m as the superposition number ny decreased less than 15. Here, the roughness of the processed surface was 0.02 $\mu$m when the superposition number ny of the spots was 2, 0.04 $\mu$m when the superposition number ny was 4, 0.08 $\mu$m when the superposition number ny was 8, and almost constant at 0.10 $\mu$m when the superposition number was no less than 15. Further, when the peak power density of a pulsed laser beam was set at $4\times 10^8$ watts/cm$^2$ and the superposition number ny of the spots in the y-direction was varied in the range of from 2 to 20, it was found that the pit depth of the processed surface, i.e. the pit depth of the glass substrate, rapidly decreased below 0.1 $\mu$m as the superposition number ny decreased below 15. Here, the pit depth of the processed surface was 0.01 $\mu$m when the superposition number ny of the spots was 2, 0.07 $\mu$m when the superposition number ny was 4, 0.09 $\mu$m when the superposition number ny was 8, and almost constant at 0.10 $\mu$m when the superposition number ny was no less than 15. On the other hand, when the superposition number of the spots ny was set at 2 and the peak power density was varied from $2 \times 10^8$ to $8 \times 10^8$ watts/cm$^2$, the pit depth of the processed surface was about 0.01 μm for the peak power density not larger than $4 \times 10^8$ watts/cm$^2$ and increased with the increase of the peak power density above $4 \times 10^8$ watts/cm$^2$, as seen from FIG. 8b. From the above results, it is seen that the roughness and the pit depth of the processed surface from which a chromium thin film has been removed is influenced by the superposition number ny of the pulse laser spots and can be suppressed below 0.10 μm by setting the superposition number ny below 15.

As exposure light for printing a circuit pattern formed in a photomask, light emitted from a mercury lamp and having a wavelength $\lambda = 3800$ Å is usually used. In the exposure and printing the surface roughness and the edges of possible pits or recesses existing in the transparent substrate, particularly at positions corresponding to the holes forming the circuit pattern, should be made to an extent in which the exposure light is not diffracted but can travel straight through the substrate. Accordingly, in order to prevent such unwanted diffraction, the surface roughness and the maximum pit depth optically may be smaller than ¼ the wavelength λ of exposure light, i.e., 0.095 μm. In the present embodiments the limit values of the surface roughness and the pit depth are shown by 0.10 μm which is slightly greater than 0.095 μm. However, the above limit values have no problem in practical use. Particularly, by setting the superposition number ny of the spots below 5 the roughness and the pit depth of the processed surface can be reduced below 0.05 μm and 0.08 μm, respectively.

Here, setting the superposition number ny of the spots at 1 means d=Py, i.e., processing spots of a diameter d are circumscribed, hence there remain un-processed regions at the circumferential portions and a two-dimensional pattern cannot be processed continuously. When the superposition number ny is set at 2, Py=½ d, hence the laser beam spots are scanned in y-direction at the pitch of ½ of the processing spot diameter and a linear pattern can be processed leaving only projections of 0.1 μm when d=2 μm. Thus, when the superposition number ny of the laser spots is set above 1.2 and the laser beam is scanned in y-direction while feeding the substrate in x-direction, the roughness or the pit depth of the processed surface is limited to those minute projections below 0.5 μm which may be formed in one scanning of the laser beam in y-direction and a linear pattern of chromium thin film can be removed perfectly from the substrate with the left-behind processed surface having surface imperfections giving substantially no influence in the exposure and development. Preferably the superposition number ny is set above 1.5. In this case, the possible projections in the left-behind surface is below 0.3 μm and the accuracy of exposure and development can be improved. It is to be noted that the above problem of the surface unevenness occurs only in the periphery of the processed region.

In the above embodiment, the laser beam pulses had a pulse width (half width of the light intensity) of 10 to 20 nanoseconds. When laser beam pulses of a pulse width of the order of 100 to 200 nanoseconds are irradiated, the glass substrate may be easily melted, evaporated and solidified in an undesirable shape with some mixture of the chromium film which gives bad effects to the glass substrate and to the exposure characteristics with a possibility of leaving deep pits in the substrate surface. Therefore, at least at the present stage, the laser beam pulses of a pulse width of 10 to 20 nanoseconds seem superior to those of a longer pulse width for processing a metal film on a transparent substrate. Further, the photomask was a chromium mask consisting of a chromium thin film evaporated on a glass substrate, but it may be an AR-coated chromium mask consisting of a chromium thin film provided with semi-transparent chromium oxide thin films on the both sides. In this case also, the composite structure may be deposited on a glass substrate with effects much than the use of the chromium film only. Similar effects can be obtained also in the case of using silicon or $Fe_2O_3$ thin film in place of the chromium thin film mask.

Further, in the above embodiments, the fine feed in x-direction was carried out by deflecting thin resilient metal bars 14a by the fine feed mechanism 15. Similar effects, can also be obtained by providing a scanning system similar to the scanning system 11 as disclosed in the above-mentioned copending U.S. application, for scanning the laser beam in x-direction. Thus, this invention is not limited to the above embodiment.

Although the description has been made on the case of correcting the defective portions of a metal thin film of a photomask, this invention can be equally applied to the case of forming a predetermined circuit pattern in a uniform metal film evaporated on a transparent substrate to form a photomask.

As has been described above, according to this invention, a photomask deposited with a metal thin film is prepared, and a pulsed laser beam is irradiated on a predetermined region of the thin film through the glass substrate from the substrate side and scanned relatively to the thin film in two-dimensional directions to remove the thin film in the predetermined region. Therefore, the thin film can be precisely removed away from the transparent substrate without causing any welding of the thin film to the transparent substrate in the periphery of the irradiated region. Further, there is no need for varying the spot size of the pulsed laser beam nor adjusting the laser output according to the area to be removed but only the scanning width is arbitrarily adjusted to remove a region larger than the spot size.

Yet further, a pulsed laser beam of a pulse width of up to at most 20 nanoseconds is irradiated and scanned with the superposition number of spots set in the range of up to 15. Therefore, the roughness and the pit depth of the processed surface from which a thin film has been removed away can be suppressed below 0.1 μm. Since the size and the location of a region of metal thin film to be removed away is preliminarily detected, a pulse generator for driving a laser source and a scanning system can be controlled by the detected information of size and location through a controller to automatically remove a thin film in the predetermined region.

What we claim is:

1. A method of removing and correcting remaining defects in a photomask comprising the steps of:
    (a) preparing a photomask comprising a transparent glass substrate, a desired circuit pattern of a thin metal film deposited on one surface thereof and having at least one defective portion of the thin metal film existing on said substrate apart from said circuit pattern after forming said circuit pattern:
    (b) positioning the defective portion of the photomask in a scanning area of a pulsed laser beam;

(c) irradiating a pulsed laser beam onto an inner surface of the defective portion of the thin metal film which contacts said substrate through the transparent glass substrate, said laser beam being focussed to provide a beam spot not greater than 5 μm in diameter;

(d) relatively scanning the pulsed laser beam with respect to said photomask in two-dimensional directions so as to scan over said defective portion of the photomask;

(e) controlling the oscillation frequency of the pulsed laser beam as well as the scanning speed of the laser beam on the defective portion of the thin metal film, and providing beam spots of said laser beam partially superimposed with a super position number in the range of from 1.2 to 15; and (f) removing the defective portion of the thin film while maintaining roughness and pit depths of the processed surface portion underlying the removed thin film portion to less than $\lambda/4$, where $\lambda$ is the wavelength of light for exposure through the photomask in use.

2. A method of removing and correcting remaining defects in a photomask comprising the steps of:

(a) preparing a photomask comprising a transparent glass substrate, a desired circuit pattern of a thin metal film deposited on one surface thereof and having at least one defective portion of the thin metal film existing on said substrate apart from said circuit pattern after forming said circuit pattern;

(b) positioning the defective portion of the photomask in a scanning area of a pulsed laser beam;

(c) irradiating onto an inner surface of the defective portion of the thin metal film which contacts said substrate through the transparent glass substrate, a pulsed laser beam having a pulse width not greater than 20 nanoseconds and a peak power density in the range of from $2 \times 10^8$ to $8 \times 10^8$ watts/cm$^2$, said laser beam being focussed to provide a beam spot not greater than 5 μm in diameter;

(d) relatively scanning the pulsed laser beam with respect to said photomask in two-dimensional directions so as to scan over said defective portion of the photomask;

(e) controlling the oscillation frequency of the pulsed laser beam as well as the scanning speed of the laser beam on the defective portion of the thin metal film, and providing beam spots of said laser beam partially superimposed with a super position number in the range from 1.2 to 15; and (f) removing the defective portion of the thin film while maintaining roughness and pit depths of the processed surface portion underlying the removed thin film portion to less than $\lambda/4$, where $\lambda$ is the wavelength of light for exposure through the photomask in use.

3. A method according to claim 2, in which said laser beam is an Ar laser beam.

4. A method according to claim 2, in which said thin metal film is formed of chromium.

5. A method according to claim 4, in which said chromium thin film is sandwiched between chromium oxide films.

6. In a method of processing a photomask by removing defects of a thin metal film disposed on a transparent glass substrate with a pulsed laser beam, said defects remaining on said substrate after forming a circuit pattern of said thin metal film on said substrate, the improvement comprising maintaining roughness and pit depths of the surface of said glass substrate less than $\lambda/4$, where $\lambda$ is the wavelength of exposure light though the photomask, by the steps of aligning the defects of the thin metal film in a scanning area of laser beam spots; irradiating said defects through said transparent substrate with said laser beam spots focussed in diameter to not more than 5 μm; maintaining a pulse width of said laser beam at not more than 20 nanoseconds and a peak power density thereof at from $2 \times 10^8$ to $8 \times 10^8$ watts/cm$^2$; and scanning said laser beam spots relative to said photomask to superpose irradiated spots of said defects by said laser beam at a superposition number ranging from 1.2 to 15 in two dimensions.

7. A method according to claim 6, in which said laser beam is an Ar laser beam.

8. A method according to claim 6, in which said thin metal film is formed of chromium.

* * * * *